United States Patent [19]

Ohkawara et al.

[11] Patent Number: 4,663,695
[45] Date of Patent: May 5, 1987

[54] HOLDING DEVICE FOR MOUNTING AN ELECTRONIC COMPONENT ON A PRINTED CIRCUIT BOARD

[75] Inventors: Eiji Ohkawara, Tokyo; Shigeru Ito, Shibata, both of Japan

[73] Assignee: Honda Giken Kogyo Kabushiki Kaisha, Tokyo, Japan

[21] Appl. No.: 790,533

[22] Filed: Oct. 23, 1985

[30] Foreign Application Priority Data

Oct. 23, 1984 [JP]   Japan ............................ 59-159928[U]

[51] Int. Cl.$^4$ ............................................. H05K 7/20
[52] U.S. Cl. .................... 361/405; 361/386; 361/419; 174/16 HS; 248/27.3
[58] Field of Search ...................... 248/27.3; 165/185; 174/35 TS, 16 HS; 357/81; 339/17 C; 361/386, 388, 400, 405, 417, 419, 424, 306, 383; 338/315, 317

[56] References Cited

U.S. PATENT DOCUMENTS 2,924,809  2/1960  Wilson ........................... 174/16 HS
3,222,580  12/1965  Curll, Jr. ......................... 174/35 TS
3,551,873  12/1970  Weyenberg ....................... 361/405
4,019,141  4/1977  Numan ............................ 174/35 TS
4,054,901  10/1977  Edwards ......................... 174/16 HS Primary Examiner—G. P. Tolin
Attorney, Agent, or Firm—Birch, Stewart, Kolasch & Birch

[57] ABSTRACT

A holding device for mounting an electronic component on a printed circuit board, is made up of an elastic plate member formed into a shape having a generally U-shaped cross section to provide a channel for receiving said electronic component therein. Thus the elastic plate member includes a pair of side plate portions for holding the electronic component therebetween. Each of the side plate portions is provided with a slot for receiving a part of a flange formed on a casing of the electronic component and a lug which is to be bound into the printed circuit board by a soldering process. By the use of this holding device, an electronic component which usually requires manual work is mounted on the pc board by an automatic soldering process.

2 Claims, 6 Drawing Figures

HOLDING DEVICE FOR MOUNTING AN ELECTRONIC COMPONENT ON A PRINTED CIRCUIT BOARD

BACKGROUND OF THE INVENTION

1. Field of the Invention

The present invention relates to a holding device for mounting an electronic component element on a printed circuit board (abbreviated to pc board hereinafter).

2. Description of Background Information

In assembling work of electronic apparatus, generally two steps are utilized for mounting various electronic components on a pc board. Initially, electronic components are fitted at predetermined locations of the pc board using an automatic process. More precisely, wire leads, pins, or lugs of the electronic components are inserted into corresponding ones of through holes of the pc board, whereby each electronic component is mechanically anchored on the pc board. Then the pc board with various electronic components thereon is dipped into molten solder in a soldering vessel (or soldering cell) so that the wire leads, pins and lugs are soldered to a conductor layer of the pc board and the electronic components are both electrically and mechanically bound into the PC board. However, some of electronic components are not suited for such an automatic soldering process. Moreover, some electronic components are even difficult to be mounted on the pc board with the automatic soldering process. For instance, in the case of the crystal resonator, it is conceivable to mount a crystal resonator on a pc board only using its wire leads. However, the body of a crystal resonator generally weighs heavier than other electronis components, and it is very likely that, after being placed at a predetermined position on the pc board by an automatic process, the crystal resonator is dislocated by vibrations while being carried to the soldering vessel by a conveyer for instance. Therefore, the crystal resonator may fall flat and not be properly soldered on the pc board. At best, there will be a soldering error in such a case. For this reason, the crystal resonator has been manually mounted on a pc board in conventional assembling works.

OBJECT AND SUMMARY OF THE INVENTION

An object of the present invention is therefore to provide a holder device for mounting, on a pc board, an electronic component which generally requires manual work during a soldering process, by which the electronic component is securely soldered by an automatic process.

According to the present invention, a holding device for mounting on a printed circuit board an electronic component having a casing member with a flange on an end thereof, comprises an elastic plate member formed into a shape having a generally U-shaped cross section and including a pair of side plate portions facing each other and defining a channel with a narrowest part whose width is slightly smaller than a smallest width of the casing member of the electronic component, each of the side plate portions being provided with a slot in which a part of the flange is received, at a portion facing the flange when the electronic component is received in the channel, and a lug to be bound into the printed circuit board, at an end of said side plate portion which defines one of ends of the channel.

DETAILED DESCRIPTION OF PREFERRED EMBODIMENT

Figure 1A:
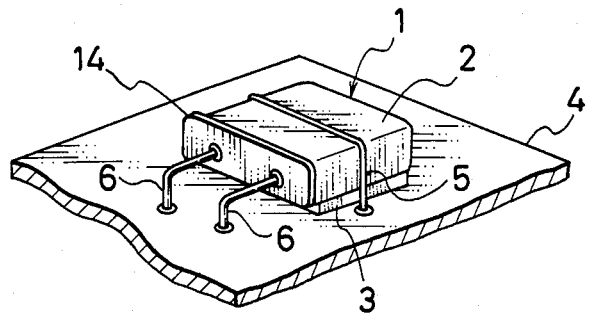
FIG. 1A is a perspective view showing a conventional manner for mounting a crystal resonator on a pc board.
Figure 1B:
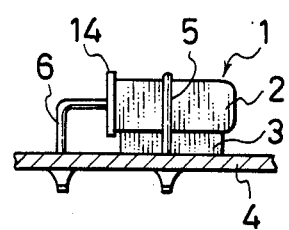
FIG. 1B is a side view corresponding to FIG. 1A.
Figure 2A:
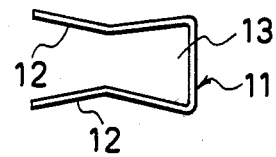
FIG. 2A is a top view of an enbodiment of the holding device according to the present invention.
Figure 3:
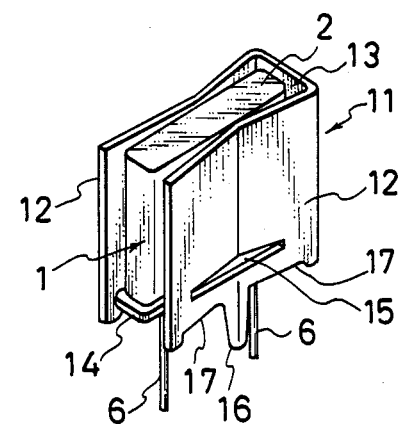
FIG. 3 is a perspective view showing a state in which a crystal resontor is placed in the holding device shown in FIGS. 2A and 2B.
Figure 2B:
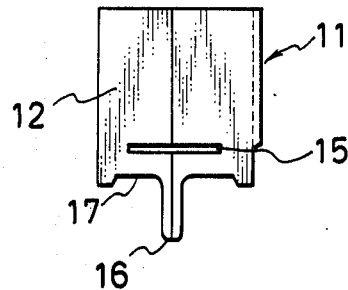
FIG. 2B is a side view of the holding device shown in FIG. 2A.
Figure 4:
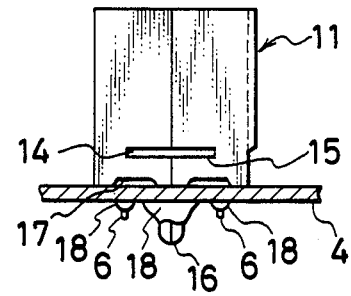
FIG. 4 is a side view showing a state in which the crystal resonator is fixed on a pc board by the solder using the holding device according to the present invention.

Before explaining the preferred embodiment of the present invention, reference is first made to FIGS. 1A and 1B showing the conventional manner for mounting a crystal resonator on a pc board.

As shown, a crystal resonator generally indicated by 1 has a casing member 2 in which a quartz element is housed. The casing member 2 is of a pillar-like shape with a rectangular cross section and positioned on a pc board 4 in such a manner that a main surface of the casing member 2 is parallel to the pc board. A buffer member 3 is inserted between the casing member 2 and the pc board 4. A pair of wire leads 6 which extend from an end of the casing member 2 are folded at the middle thereof and their tips are inserted into corresponding holes of the pc board 4 and fixed thereto by soldering. Further, a pair of plated copper wires 5 folded into a U-shape are provided so as to straddle the casing member 2. Both ends of the plated copper wires 5 are soldered on the pc board 4 so that the casing member 2 is fixed to the pc board in a manner that it is pressed against the pc board 4. Thus, some electronic components such as the crystal resonator have been requiring manual work for being mounted on the pc board, and it has long been desired that an electronic component usually requiring manual mounting work be soldered into the pc board in a soldering vessel using an automatic process.

The single embodiment of the present invention will be explained with reference to FIGS. 2A, 2B through 4 of the attached drawing.

In FIGS. 2A, 2B, 3 and 4, a holding device according to the present invention is generally denoted by 11. The holding device 11 is used for mounting, as an example, a crystal resonator 1 on a pc board 4. The holding device 11 is made of a metal or resin plate having elasticity such as a plate of phosphor bronze or a synthetic resin. The holding device 11 is formed into a symmetric shape with generally U-shaped horizontal cross section as typically shown in FIG. 2A. More specifically, the holding device 11 has a pair of side plate portions 12 which face each other and spaced at a distance so that a channel 13 for receiving the crystal resonator 1 is formed therebetween. Each of the side plate portions 12 is bent slightly outwardly along a vertical line substantially in the middle part thereof. A minimum width of the channel 13 between the side plate portions 12 is determined slightly narrower than a minimum width of a casing 2 of the crystal resonator 1 having a rectangular cross section. On the other hand, as shown in FIG. 1, the casing 2 of the crystal resonator 1 has a flange portion 14 at a lower end part thereof. Correspondingly, slots or elongated holes 15 are respectively provided for the side plate portions 12 of the holding device 11 at a lower part thereof facing the flange portion 14 of the casing 2 of the crystal resonator 1 when the latter is placed in the channel 13 as typically illustrated in FIG. 3. Each of the side plate portions 12 are provided, at a lower end thereof, a lug 16 for the purpose of fixing the holding device 11 to the pc board 4. Further, each of the side plate portions 12 are provided, in the lower end thereof, a pair of recesses 17 on both sides of the lug 16.

With the thus constructed holding device 11 according to the present invention, the crystal resonator 1 is inserted into the channel 13 between the side plate portions 12 from an open front end of the channel 13 so that corresponding portions of the flange portion 14 of the casing 2 are received in the elongated holes 15 as the insertion of the crystal resonator 1 into the channel 13. After setting the crystal resonator 1 in the holding device 11 in this way, the holding device 11 with the crystal resonator 1 is mounted on the pc board 4 by inserting the lugs 16 of the holding device 11 and wire leads 6 of the crystal resonator 1 into corresponding holes of the pc board 4. Then the lugs 16 and the wire leads 6 are fixed to the pc board by dipping the pc board into the molten solder using a soldering vessel.

Additionally, the purpose of providing the recess 17 is to form a clearance for preventing the lower ends of the side plate portions 12 on both sides of the lug 16 from contacting the surface of the pc board 4. This provision is quite important if the pc board 4 is of a double sided type. With this provision, the soldering is performed without any failure. A distance between the surface of pc board 4 and a lower surface of the crystal resonator 1 is determined by the vertical position of the elongated hole 15 in the side plate portion 12.

It will be appreciated from the foregoing, that according to the present invention, the flange portion of an electronic component is received in an elongated hole formed in a lower end part of a pair of side plate portions facing each other. With this provision, it is possible to mount an electronic component while it is securely held in the holding device. Additionally, the holding device itself is securely connected to the pc board by its lugs which themselves are inserted into fitting holes formed in the pc board. At the same time, the holding device stands stably on the pc board at least at four points of the lower end of the side plate portions. With this feature, the falling or the dislocation of the electronic component on the pc board due to the vibrations during the movement to the soldering vessel after the positioning of electronic components on the pc board is prevented. Thus, it is possible to securely solder an electronic component usually requiring manual work, using an automatic soldering process.

What is claimed is:

1. A holding device mounting on a printed circuit board an electronic component having a casing member with a flange on an end thereof, comprising an elastic plate member formed into a shape having a generally U-shaped cross section, said elastic plate member including a pair of side plate portions facing each other and defining a channel with a narrowest part whose width is slightly smaller than a smallest width of said casing member of said electronic component, each of said side plate portions being provided with a slot in which a part of said flange is received, and a lug bound into said printed circuit board, at an end of said side plate portion which defines one of the ends of said channel.

2. A holding device as set forth in claim 1, wherein said lug is provided at a middle of a length of said side plate portion and a pair of recesses are provided to an edge of said side plate portion on both sides of said lug.

* * * * *